(12) United States Patent
Miyamura et al.

(10) Patent No.: US 6,992,893 B2
(45) Date of Patent: Jan. 31, 2006

(54) HEAT SINK ATTACHMENT

(75) Inventors: Harold Miyamura, Roseville, CA (US); Rong-Che Chen, Irvine, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 67 days.

(21) Appl. No.: 10/340,369

(22) Filed: Jan. 10, 2003
(Under 37 CFR 1.47)

(65) Prior Publication Data

US 2004/0136161 A1 Jul. 15, 2004

(51) Int. Cl.
*H05K 7/20* (2006.01)

(52) U.S. Cl. .................. 361/705; 361/704; 361/710; 361/719; 165/80.3; 174/16.3; 257/707; 257/718; 257/719; 257/727; 248/510; 24/458

(58) Field of Classification Search ........ 361/697–720, 361/721–724; 165/80.3, 80.4, 165, 185; 257/706–727; 174/15.1, 16.3, 35 C; 24/296, 24/625; 248/505; 428/40.1, 40.2, 41.9, 428/131, 137, 354; 29/832, 840
See application file for complete search history.

(56) References Cited

U.S. PATENT DOCUMENTS

| | | | | |
|---|---|---|---|---|
| 5,168,926 A | * | 12/1992 | Watson et al. | 165/185 |
| 5,638,597 A | * | 6/1997 | Cutting et al. | 29/830 |
| 5,804,875 A | * | 9/1998 | Remsburg et al. | 257/718 |
| 5,917,700 A | * | 6/1999 | Clemens et al. | 361/704 |
| 6,162,663 A | * | 12/2000 | Schoenstein et al. | 438/122 |
| 6,432,497 B2 | * | 8/2002 | Bunyan | 428/40.1 |
| 6,434,004 B1 | * | 8/2002 | Matteson | 361/704 |
| 6,496,373 B1 | * | 12/2002 | Chung | 361/705 |
| 6,644,395 B1 | * | 11/2003 | Bergin | 165/185 |
| 6,649,258 B2 | * | 11/2003 | Yamada et al. | 428/334 |
| 6,705,388 B1 | * | 3/2004 | Sorgo | 165/80.3 |

FOREIGN PATENT DOCUMENTS

JP    02000251463 A  *  9/2000

* cited by examiner

Primary Examiner—Michael Datskovskiy (57) ABSTRACT

An apparatus in one example comprises one or more adhesives that serve to provide at least primary attachment of a heat sink with one or more electrical components coupled with a circuit board.

60 Claims, 7 Drawing Sheets

HEAT SINK ATTACHMENT

BACKGROUND

Attached to an electrical component mounted to a circuit board in one design of a computer is a heat sink that serves to draw heat from the electrical component and dissipate the heat into the environment. Fasteners serve to attach the heat sink to the electrical component. The fasteners comprise two metal clips. The electrical component comprises a microprocessor. A firm connection of the two metal clips with the circuit board and the heat sink serves to press the heat sink against the microprocessor.

The metal clips serve to hold and center the heat sink firmly against the microprocessor to effect mounting and thermal conductivity. So, the design requires the clips to be large and therefore comprise relatively large quantities of metal. In addition, the firm connection of the metal clips to the circuit board as well as the metallic abutment of the clips with the heat sink allow vibration and shock imparted to the circuit board to be transmitted to, and possibly dislodge, the heat sink and consequently damage the microprocessor and/or other electrical components.

DESCRIPTION OF THE DRAWINGS

Features of exemplary implementations of the invention will become apparent from the description, the claims, and the accompanying drawings in which:

DETAILED DESCRIPTION

Figure 1:
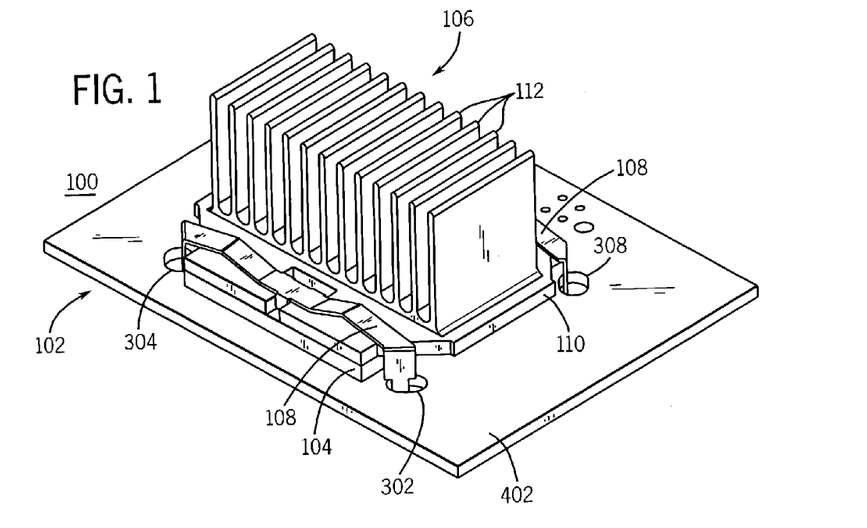
FIG. 1 is a top, perspective representation of one side of an exemplary implementation of an apparatus that comprises a circuit board, one or more electrical components, one or more heat sinks, and one or more clips.
Figure 2:
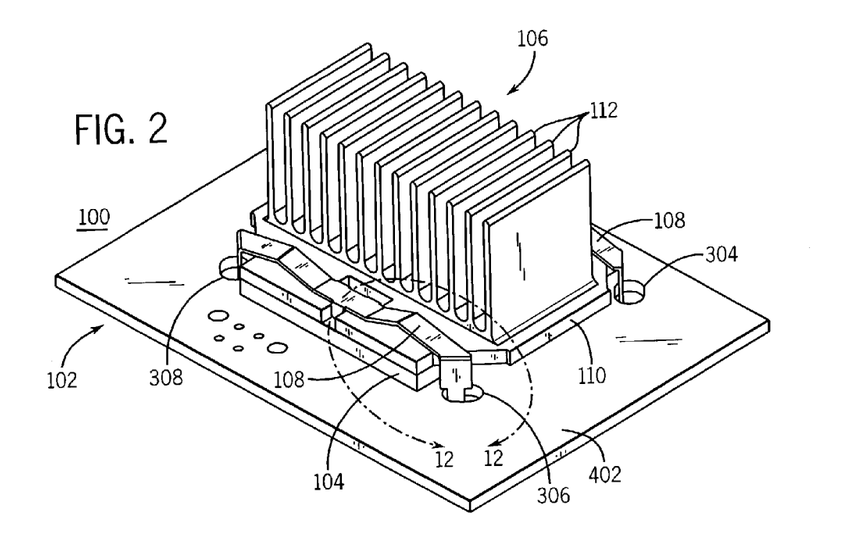
FIG. 2 is a top, perspective representation of another side of the apparatus of FIG. 1.

Turning to FIG. 1, an apparatus 100 in one example comprises one or more adhesives that serve to provide at least primary attachment of a heat sink with one or more electrical components coupled with a circuit board. The apparatus 100 in one example includes a plurality of components such as computer hardware components. A number of such components can be combined or divided in one example of the apparatus 100. The apparatus 100 in one example comprises any (e.g., horizontal, oblique, or vertical) orientation, with the description and figures herein illustrating one exemplary orientation of the apparatus 100, for explanatory purposes.

Referring to FIG. 1, the apparatus 100 comprises a circuit board 102, one or more electrical components 104, one or more adhesives 602 (FIG. 6), one or more heat sinks 106, and one or more clips 108. In one example, the circuit board 102 comprises a printed circuit board ("PCB"). The circuit board 102 serves to support a number of items, for example, the electrical components 104 and electrical connections (not shown) between the electrical components 104. The circuit board 102 supports one or more of the electrical components 104 having one or more of the heat sinks 106 attached thereto. In addition, the circuit board 102 supports one or more of the electrical components 104 lacking attachment to any of the heat sinks 106. A subset or all of the electrical components 104 are coupled with each other on the circuit board 102.

Figure 3:
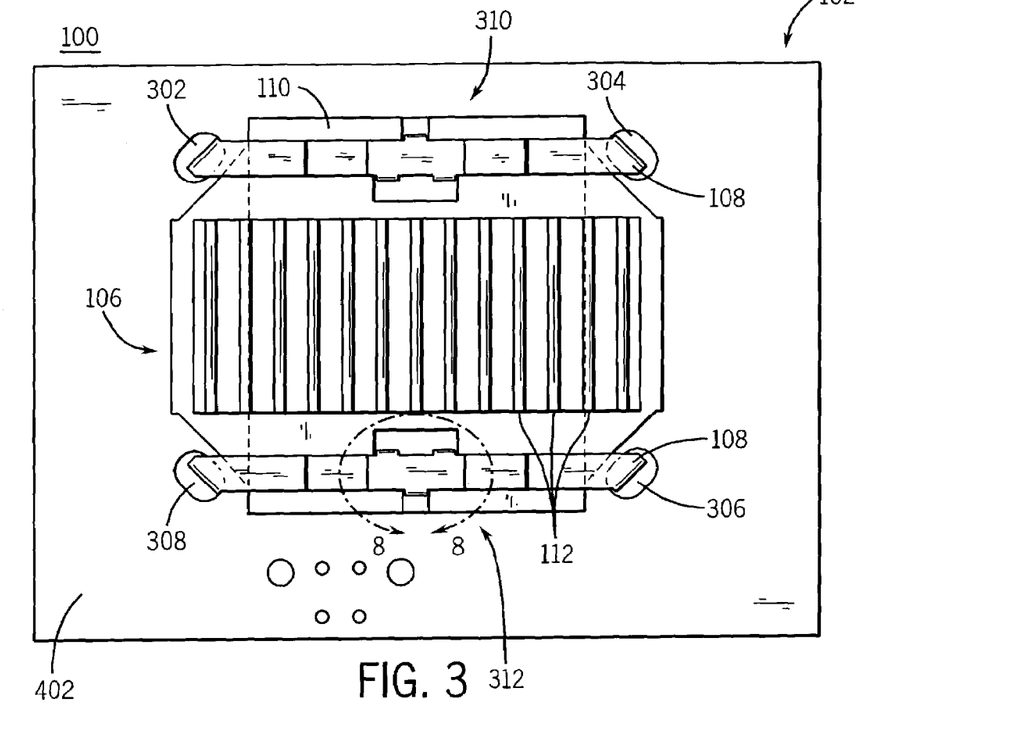
FIG. 3 is a top representation of the apparatus of FIG. 1.
Figure 4:
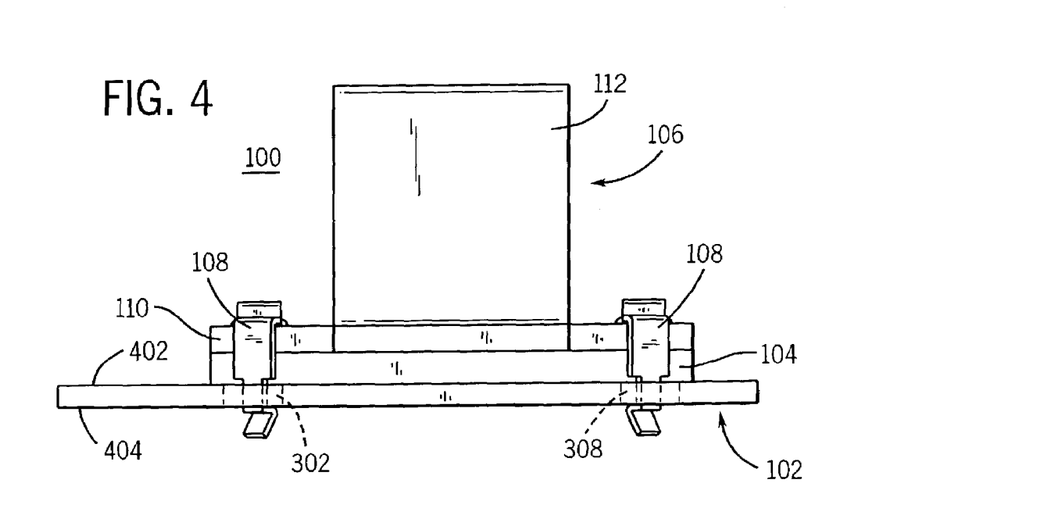
FIG. 4 is a side representation of the apparatus of FIG. 1.
Figure 5:
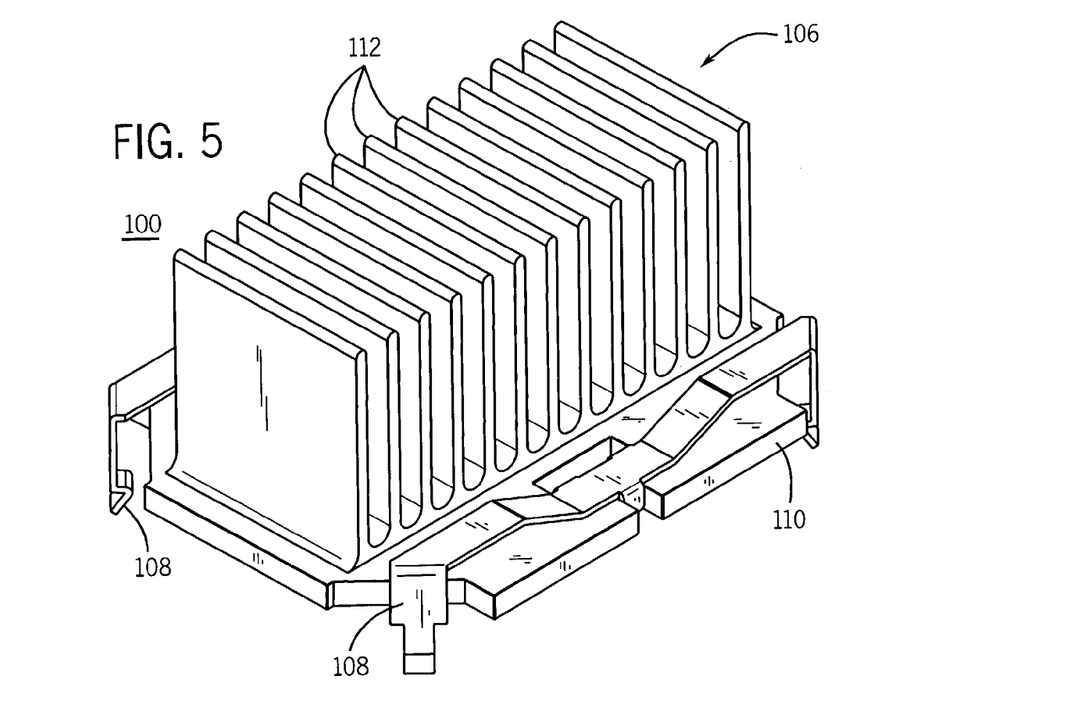
FIG. 5 is one perspective representation of one of the heat sinks and a pair of the clips of the apparatus of FIG. 1.

Referring to FIGS. 1 and 3–4, the circuit board 102 comprises passages 302, 304, 306, and 308 and major faces 402 and 404. In one example, the passages 302, 304, 306, and 308 comprise openings that extend between the major faces 402 and 404. The passages 302, 304, 306, and 308 receive respective arms of the clips 108 extending between the major faces 402 and 404. The passages 302, 304, 306, and 308 serve to cooperate with the clips 108 to hold the heat sink 106 in place atop the electrical component 104 while the adhesive 602 solidifies to attach the heat sink 106 to the electrical component 104, as described herein.

The major faces 402 and 404 comprise surface areas that are larger than any other faces of the circuit board 102. In addition, the major face 402 comprises a top or component side of the circuit board 102. The major face 402 serves to support the electrical components 104, for example, in engagement with the clips 108. The major face 404 serves to support electrical interconnection of the electrical components 104, for example, by supporting printed circuit traces (not shown) located on the major face 404. In one example, the major face 404 comprises a trace or print side of the circuit board 102. In a further example, the major face 404 comprises a surface that abuts the ends of the clips 108.

Again referring to FIG. 1, the electrical components 104 superimpose the major face 402 of the circuit board 102. The electrical component 104 comprises a component of electrical circuitry on the circuit board 102. In one example, the electrical component 104 comprises a computer microprocessor. In another example, the electrical component 104 comprises a transistor, resistor, or capacitor. The electrical components 104 are electrically and mechanically coupled with the circuit board 102.

The heat sink 106 superimposes the major face 402 of the circuit board 102. The heat sink 106 serves to draw heat away from one or more of the electrical components 104. The heat sink 106 in one example comprises one or more metals, for example, aluminum extrusion. One or more attachments serve to couple the heat sink 106 with one or more of the electrical components 104. In one example, referring to FIGS. 1 and 6, one or more of the adhesives 602 serve to provide at least primary attachment of the heat sink 106 with one or more of the electrical components 104, as described herein.

Figure 6:
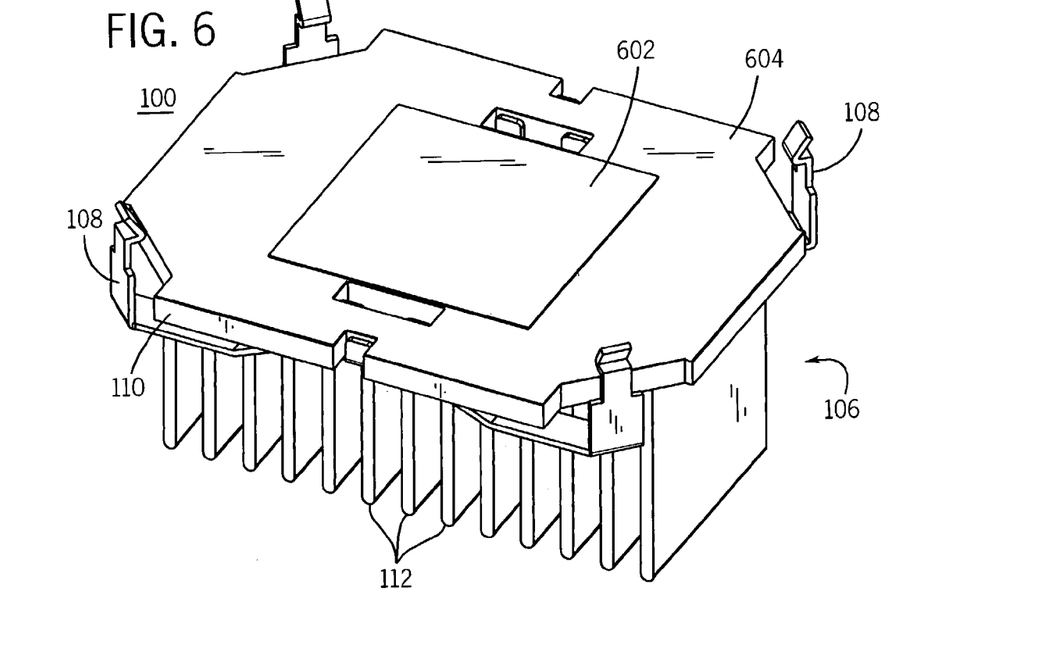
FIG. 6 is another perspective representation of the heat sink and the pair of clips of the apparatus of FIG. 5, and illustrates one or more adhesives located on a face of the heat sink.

The heat sink 106 comprises a base 110, a plurality of fins 112, one or more engagement portions, for example, engagement portions 310 (FIG. 3) and 312 (FIG. 3), and a face 604 (FIG. 6). The base 110 serves to provide a mechanical support and/or connection structure for the adhesive 602 and the fins 112. In addition, the base 110 serves to provide a thermal drainage path from the electrical component 104 and the adhesive 602 to the fins 112.

The fins 112 serve to transfer, to ambient air, heat conducted from the electrical component 104 and through the adhesive 602 and the base 110, and/or from the electrical component 104 and through the base 110 alone. The fins 112 are spaced apart and extend away the electrical component 104. In one example, the fins 112 serve to allow convective cooling by the air to remove heat conducted to the surface of the fins 112. In a further example, a fan (not shown) serves to enhance the convective cooling by forcing quantities of air past the fins 112 for heat removal. In a still further example, the fins 112 serve to promote development of temperature gradients that cause thermal conduction of heat along the length of the fins 112 away from the electrical component 104 for cooling thereof.

Figure 9:
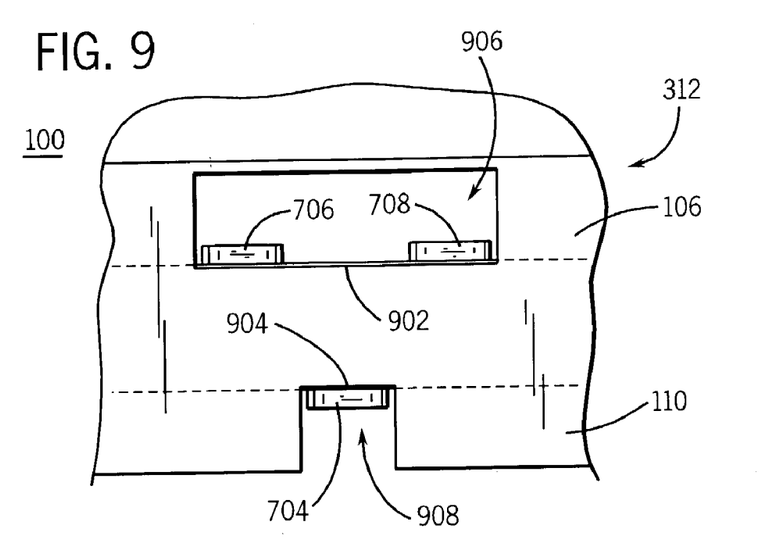
FIG. 9 is a bottom representation of the region of FIG. 8.
Figure 10:
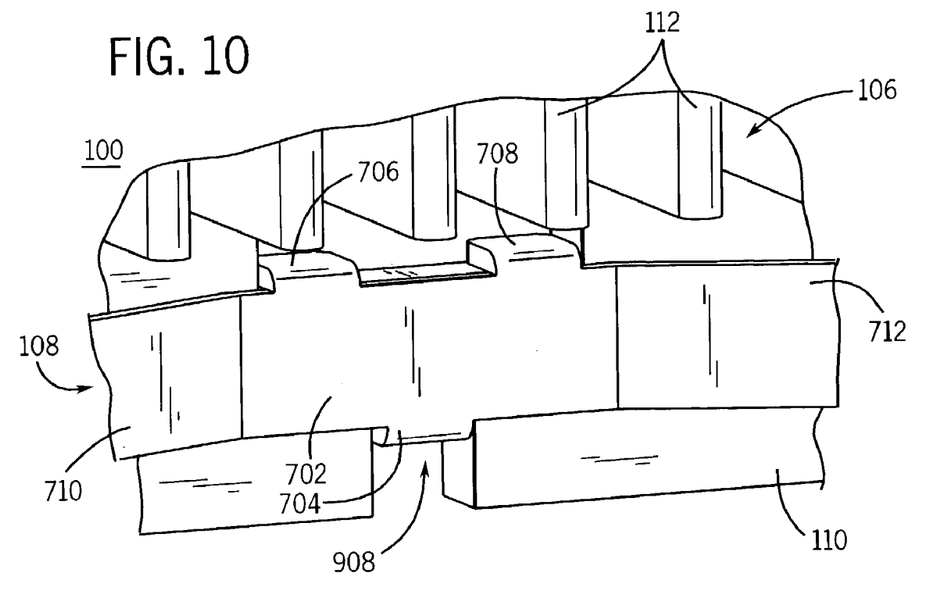
FIG. 10 is a top, perspective representation of the region of FIG. 8.
Figure 11:
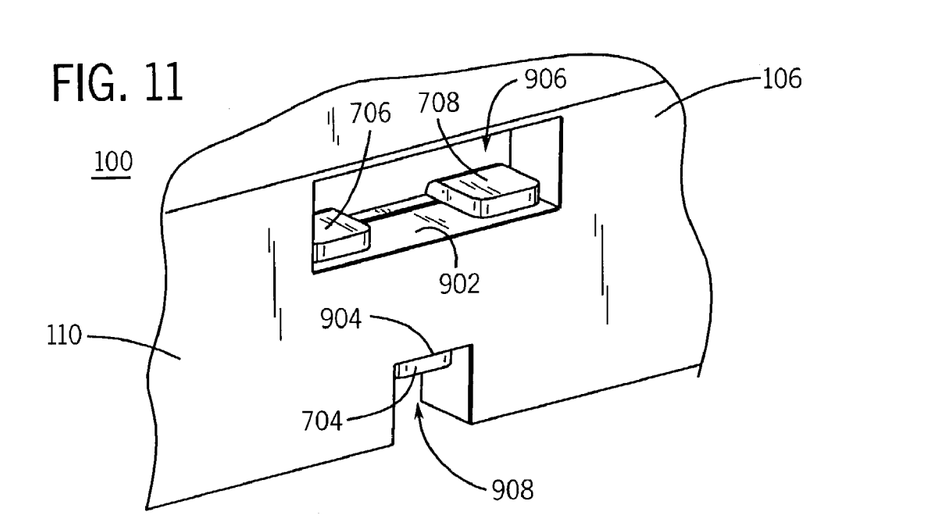
FIG. 11 is a bottom, perspective representation of the region of FIG. 8.
Figure 12:
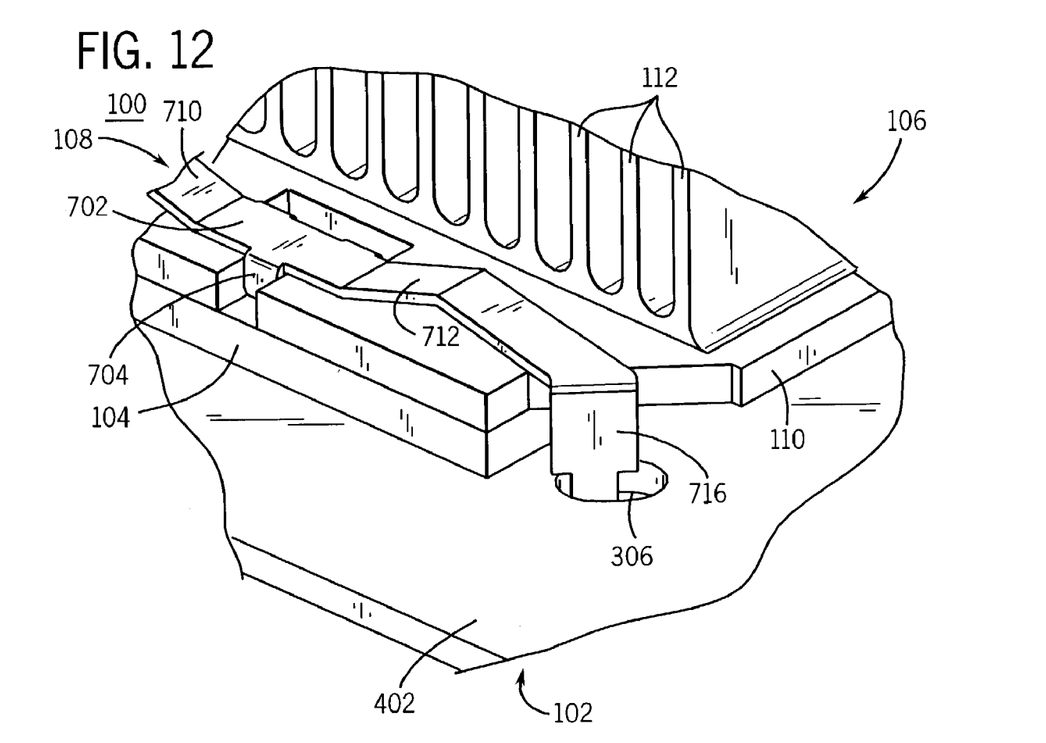
FIG. 12 is a partial, enlarged, perspective representation of a region of the circuit board, one of the electrical components, one of the heat sinks, and one of the clips of the apparatus of FIG. 2 indicated by line 12—12 therein.
Figure 13:
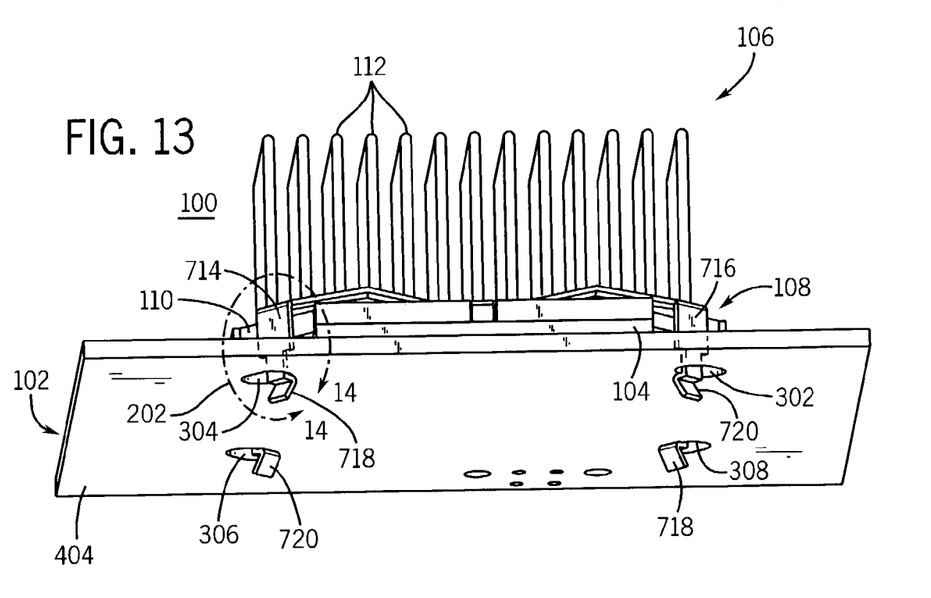
FIG. 13 is a bottom, perspective representation of the one side the apparatus of FIG. 1.
Figure 14:
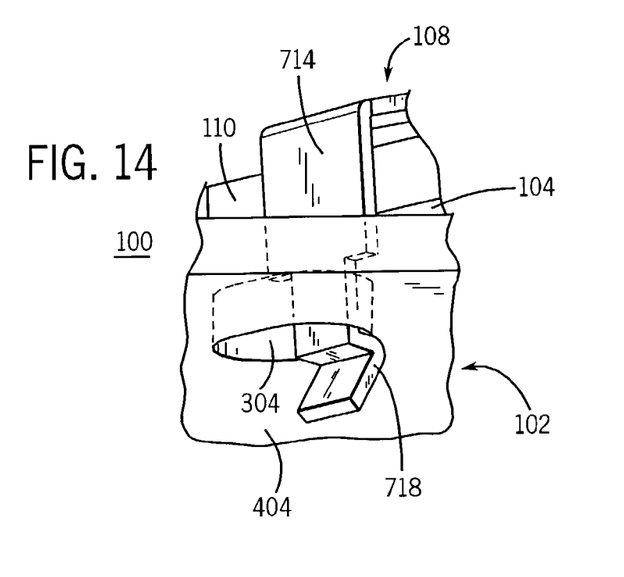
FIG. 14 is a partial, enlarged, perspective representation of a region of the circuit board, one of the electrical components, one of the heat sinks, and one of the clips of the apparatus of FIG. 13 indicated by line 14—14 therein.

Referring to FIG. 3, the engagement portions 310 and 312 serve to engage one or more portions of the clips 108. Referring to FIGS. 3 and 9, the engagement portion 312 comprises walls 902 and 904 and recesses 906 and 908. The walls 902 and 904 define one or more portions of the recesses 906 and 908. The recesses 906 and 908 serve to receive one or more portions of the clips 108, for example, to securely connect the clips 108 with the heat sink 106. In one example, one or more portions of the clip 108 are crimped against one or more of the walls 902 and 904.

Referring to FIGS. 1 and 6, the face 604 is coupled with the electrical component 104 to draw heat therefrom to the fins 112. The adhesive 602 in one example serves to indirectly couple a portion of the face 604 with the electrical component 104. In a further example, a portion of the face 604 directly contacts the electrical component 104.

The adhesive 602 is located between the electrical component 104 and the heat sink 106. In one example, the adhesive 602 covers and/or coats a portion of the face 604 of the heat sink 106 for attachment with the electrical component 104. In another example, the adhesive 602 covers and/or coats a portion of a face of the electrical component 104 for attachment with the heat sink 106. In a further example, the adhesive 602 comprises a pressure-sensitive adhesive that serves to form a bond when placed under pressure. In a still further example, the adhesive 602 comprises a thermally-conductive material that serves to conduct heat from a portion of the electrical component 104 to the heat sink 106. The adhesive 602 in one example comprises a material offered by Chomerics, Division of Parker Hannifin Corporation (77 Dragon Court, Woburn, Mass., 01888-4014, www.chomerics.com), under the trade identifier "T-410."

The adhesives 602 in one example serve to provide at least primary attachment of the heat sink 106 with one or more of the electrical components 104. In a further example, the adhesives 602 serve to promote thermal conductivity between the electrical components 104 and the heat sink 106. One or more of the adhesives 602 serve to conduct heat from one or more portions of the electrical components 104 to the heat sink 106. In another example, the adhesives 602 serve to conduct heat from a first portion of the electrical component 104 to the heat sink 106, where a second portion of the electrical component 104 directly contacts and transfers heat to the heat sink 106. In a still further example, the adhesive 602 serves to absorb a portion of one or more vibrations.

Vibrations can potentially reach the circuit board 102 before and/or after assembly. The vibrations can comprise repetitive patterns and/or sudden shocks. In one example, a vehicle employed for transportation of the circuit board 102 encounters vibrations that the vehicle transmits to the circuit board 102. In another example, an individual handling and/or operating the apparatus 100 or a portion thereof transmits vibrations to the circuit board 102.

In one example, the vibrations are transmitted along the circuit board 102 to the electrical component 104. In another example, the vibrations are transmitted over the circuit board 102, through the clip 108, and to the heat sink 106. The adhesive 602 serves to absorb a portion of the vibrations. The adhesive 602 absorbs a portion of one or more vibrations transmitted to the adhesive 602 from the electrical component 104 and/or a portion of one or more vibrations transmitted to the adhesive 602 from the clip 108 and the heat sink 106. One or more of the vibrations in one example experience dampening and/or decay before reaching the adhesive 602, for example, owing to friction encountered during transmission through the circuit board 102 and the electrical component 104 or the clip 108 and the heat sink 106.

The adhesive 602 absorbs an amount of the vibrations effective to avoid compromising the attachment of the heat sink 106 and the electrical component 104. In a further example, the adhesive 602 serves to prevent vibration of the clip, for example, at a harmonic frequency out of phase with the circuit board 102 and/or the heat sink 106. The adhesive 602 serves to promote maintenance of the attachment of the heat sink 106 and the electrical component 104. By absorbing the portion of the vibrations, the adhesive 602 serves to prevent the portion of the vibrations from loosening the attachment between the electrical component 104 and the heat sink 106. So, the heat sink 106 continues to perform cooling of the electrical component 104. In addition, the adhesive 602 serves to prevent the heat sink 106 from becoming free from the electrical component 104. The adhesive 602 therefore serves to avoid potential harm (e.g., impact) that otherwise could befall one or more other portions of the apparatus 100 upon separation of the heat sink 106 from the electrical component 104.

The adhesive 602 serves to provide at least a primary mechanical connection between the electrical component 104 and the heat sink 106. The adhesive 602 serves to bond and/or securely join a portion of the face 604 of the heat sink 106 to a portion of the electrical component 104. In one example, the adhesive 602 comprises an adhesive of substantially uniform consistency. In another example, the adhesive 602 comprises a plurality of adhesives 602. The plurality of adhesives 602 in one example are applied contemporaneously. In another example, the plurality of adhesives 602 are applied successively. In a further example, the plurality of adhesives 602 are applied in any of a variety of relative positions. For example, one employment of multiple adhesives 602 serves to combine superior bonding strength of one adhesive 602 with superior thermal conductivity of another adhesive 602.

The at least primary attachment of the electrical component 104 and the heat sink 106 by the one or more adhesives 602 dominates any other attachment of the electrical component 104 and the heat sink 106. Upon solidification of the adhesive 602, the clips 108 need not participate or contribute in the secure mechanical connection between the electrical component 104 and the heat sink 106. After solidification of the adhesive 602 between the electrical component 104 and the heat sink 106, the clips 108 in one example are removable from the heat sink 106 and the circuit board 102 without compromise to the secure mechanical connection between the electrical component 104 and the heat sink 106. In another example, the adhesive 602 is dominant over yet still cooperates with the clips 108 in attachment of the electrical component 104 with the heat sink 106. The strength of the attachment of the electrical component 104 and the heat sink 106 contributed by the one or more adhesives 602 dominates a strength of attachment contributed by one or more of the clips 108. For example, the strength of the attachment provided by the adhesive 602 is far greater than the strength of any attachment provided by one or more of the clips 108.

Figure 7:
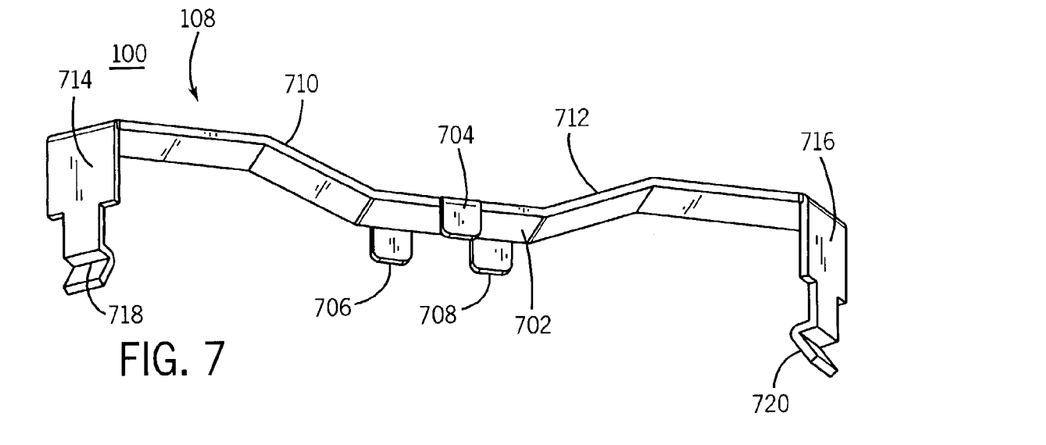
FIG. 7 is an enlarged, perspective representation of one of the clips of the apparatus of FIG. 1.
Figure 8:
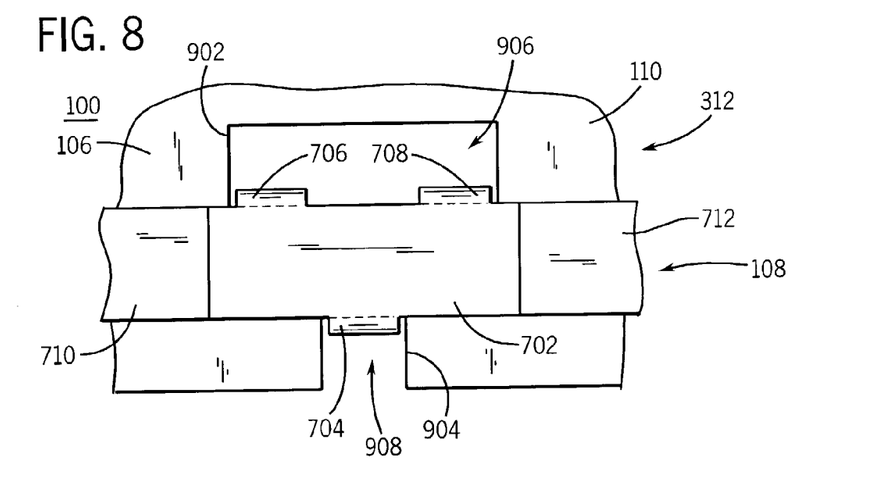
FIG. 8 is a partial, enlarged, top representation of a region of one of the heat sinks and one of the clips of the apparatus of FIG. 3 indicated by line 8—8 therein.

Referring to FIGS. 3 and 6–7, the clip 108 serves to hold the heat sink 106 in position while the adhesive 602 bonds the heat sink 106 to the electrical component 104. For example, the passages 302, 304, 306, and 308 cooperate with the clips 108 to hold the heat sink 106 at one or more target locations relative to the electrical component 104 while the adhesive 602 solidifies to attach the heat sink 106 to the electrical component 104. The target location in one example comprises a relative location between the face 604 and the electrical component 104. With the adhesive 602 in one example freshly applied to the face 604, the heat sink 106 is positioned at the target location to allow formation and solidification of a bond by the adhesive 602 between the face 604 and the electrical component 104.

The clip 108 in one example comprises stainless steel. In one example, the clip 108 comprises a unitary construction and/or integral formation. In a still further example, the clip 108 comprises an approximate thickness of 0.6 millimeters. For example, the clip 108 comprises an interface portion 702, intermediate spring portions 710 and 712, arm portions 714 and 716, and end spring portions 718 and 720.

The interface portion 702 serves to engage the heat sink 106 for force transmission to and/or from the heat sink 106. The interface portion 702 is located between the intermediate spring portions 710 and 712. When the clip 108 is installed on the heat sink 106 and the circuit board 102, the interface portion 702 and the intermediate spring portions 710 and 712 superimpose the major face 402 of the circuit board 102.

The intermediate spring portions 710 and 712 are coupled with the arm portions 714 and 716, respectively. The arm portions 714 and 716 terminate in the end spring portions 718 and 720, respectively. The intermediate spring portions 710 and 712 and the end spring portions 718 and 720 comprise a resiliency and/or tendency to bend and/or apply an opposing and/or restorative force when forced from a free state, as will be appreciated by those skilled in the art.

Referring to FIGS. 3 and 7, the interface portion 702 of the clip 108 in one example is force-transmittingly engageable with any one of the engagement portion 310 of the heat sink 106 and the engagement portion 312 of the heat sink 106. In a further example, the arm portion 714 is extendable through any one of the passage 304 in the circuit board 102 and the passage 308 in the circuit board. In a still further example, the arm portion 716 is extendable through any one of the passage 302 in the circuit board 102 and the passage 306 in the circuit board. The end spring portions 718 and 720 are abuttable with any of a plurality of locations on the major face 404 (FIG. 4) of the circuit board 102. So, an installer of the clips 108 need not worry about selection of any particular clip 108 from a pair or supply of the clips 108, since any of the clips 108 works along either side of the heat sink 106.

The interface portion 702 comprises legs 704, 706, and 708. The legs 704, 706, and 708 are engaged with the heat sink 106 in a force-transmission relationship. In one example, referring to FIG. 9, the recess 906 of the heat sink 106 receives the leg 704 of the clip 108 and the recess 908 of the heat sink 106 receives legs 706 and 708 of the clip 108. For example, the leg 704 is crimped against the wall 904 of the heat sink 106 and the legs 706 and 708 are crimped against the wall 906 of the heat sink 106 for secure attachment of the clip 108 to the heat sink 106.

Referring to FIGS. 1, 6–7, and 13–14, the end spring portions 718 and 720 in one example are configured to, upon forced abutment thereof with the major face 404 of the circuit board 102, cooperate with additional portions of the apparatus 100 to cause an expansion force to be applied at one or more of the engagement portions 310 and 312 of the heat sink 106. The expansion force comprises first components directed toward the major face 402, and second components directed in either of two generally opposite directions along the major face 402. So, the expansion force serves to promote distribution of force over the adhesive 602 and between the face 604 and the electrical component 104. In addition, the expansion force serves to promote avoidance of localized concentration of force at an isolated point of any of the adhesive 602, the face 604, and the electrical component 104. Also, the expansion force serves to promote formation of a secure and broad bond of the adhesive 602 between the face 604 and the electrical component 104, as described herein.

The end spring portions 718 and 720 are positioned, formed, and compressed to exert force against a portion of the major face 404 adjacent one of the passages 302, 304, 306, and 308. This force comprises components that serve to tend to press the end spring portions 718 and 720 generally away from a location on the major face 404 between one or more of the passages 302, 304, 306, and 308. For example, the force exerted by the end spring portion 718 against a portion of the major face 404 adjacent the passage 306 comprises a component that serves to tend to press the end spring portion 718 generally away from a central location on the major face 404 between the passages 302, 304, 306, and 308.

So, deflection of the end spring portions 718 and 720 by the major face 404 creates a tension in the clip 108 that tends to pivot the arm portions 714 and 716 outward from the interface portion 702 and pull the intermediate spring portions 710 and 712 away from the interface portion 702. The outward pull on the intermediate spring portions 710 and 712 promotes a deflection thereof away from the interface portion 702. The intermediate spring portions 710 and 712 respond by pulling outward on the interface portion 702 and creating the expansion force at the interface portion 702. The expansion force at the interface portion 702 serves to promote distribution of a force applied from the interface portion 702 to the engagement portion 310 or 312 of the heat sink 106. The distribution of the force serves to promote a more thorough and greater expanse of bonding of the adhesive 602 with the electrical component 104, for example, where the adhesive 602 has been initially applied to the face 604 of the heat sink 106.

In one example of assembly of the apparatus 100, the adhesive 602 is applied to the face 604 of the heat sink 106. The adhesive 602 is substantially centered on the face 604, for example, to promote mechanical bonding and/or thermal conductivity. In one example where multiple adhesives 602 are employed, the adhesives 602 collectively are substantially centered on the face 604. In a further example where multiple adhesives 602 are employed, one or more of the adhesives 602 are located about and/or overlap a central portion of the face 604. In another example where multiple adhesives 602 are employed, each of the adhesives 602 is substantially centered on the face 604.

With the adhesive 602 applied to the face 604, the heat sink 106 is placed on the electrical component 104 coupled with the circuit board 102. The clips 108 are coupled with the circuit board 102 and the heat sink 106 to hold the heat sink 106 in position on the electrical component 104 while the adhesive 602 forms a bond between the heat sink 106 and the electrical component 104. The clips 108 serve to ensure proper alignment of the heat sink 106 with the electrical component 104 during bonding by the adhesive 602. For example, the clips 108 serve to substantially center the face 604 on the electrical component 104.

The steps or operations described herein are just exemplary. There may be many variations to these steps or operations without departing from the spirit of the invention. For instance, the steps may be performed in a differing order, or steps may be added, deleted, or modified.

Although exemplary implementations of the invention have been depicted and described in detail herein, it will be apparent to those skilled in the relevant art that various modifications, additions, substitutions, and the like can be made without departing from the spirit of the invention and these are therefore considered to be within the scope of the invention as defined in the following claims.

What is claimed is:

1. An apparatus, comprising:
   one or more adhesives that serve to provide at least primary attachment of a heat sink with one or more electrical components coupled with a circuit board; and
   a clip coupled with the heat sink and the circuit board;
   wherein the clip comprises first and second spring portions, an interface portion therebetween, first and second arm portions, and first and second end portions, wherein the first spring portion is coupled with the first arm portion, wherein the first arm portion terminates in the first end portion, wherein the second spring portion is coupled with the second arm portion, wherein the second arm portion terminates in the second end portion;
   wherein the interface portion comprises a plurality of legs that engage one or more recesses of an engagement portion of the heat sink;
   wherein the plurality of legs of the interface portion are force transmittingly engageable with the engagement portion of the heat sink;
   wherein the first arm portion is extendable through a first passage between first and second major faces of the circuit board;
   wherein the first end portion is abuttable with the second major face;
   wherein the second arm portion is extendable through a second passage between the first and second major faces;
   wherein the second end portion is abuttable with the second major face.

2. The apparatus of claim 1, wherein the one or more adhesives are located between the heat sink and the one or more electrical components.

3. The apparatus of claim 1, wherein the one or more adhesives are substantially centered on a face of the heat sink.

4. The apparatus of claim 1, wherein one or more of the one or more adhesives serve to conduct heat from a portion of the one or more electrical components to the heat sink.

5. The apparatus of claim 1, wherein one or more of the one or more adhesives comprise one or more thermally-conductive materials.

6. The apparatus of claim 1, wherein the one or more adhesives serve to absorb a portion of one or more vibrations transmitted thereto to promote maintenance of the at least primary attachment, by the one or more adhesives, of the heat sink with the one or more electrical components.

7. The apparatus of claim 1, wherein the one or more adhesives serve to absorb a portion of a vibration, imparted to the circuit board and transmitted to the one or more electrical components, to prevent transmission of the portion of the vibration to the heat sink.

8. The apparatus of claim 7, wherein the portion of the vibration comprises a portion of a first vibration, wherein the one or more adhesives serve to absorb a portion of a second vibration, imparted to the circuit board and transmitted to the heat sink through one or more clips, to prevent transmission of the portion of the second vibration to the one or more electrical components.

9. The apparatus of claim 1, wherein the one or more adhesives serve to absorb a portion of a vibration, imparted to the circuit board and transmitted to the heat sink through one or more clips, to prevent transmission of the portion of the vibration to the one or more electrical components.

10. The apparatus of claim 1,
    wherein a vibration absorption property of the one or more adhesives dominates a vibration absorption property of the clip.

11. The apparatus of claim 10, wherein the clip comprises a unitary construction.

12. An apparatus, comprising:
    one or more adhesives that serve to provide at least primary attachment of a heat sink with one or more electrical components coupled with a circuit board; and
    a plurality of clips coupled with the heat sink and the circuit board;
    wherein a vibration absorption property of the at least primary attachment, by the one or more adhesives, of the heat sink with the one or more electrical components dominates a vibration absorption property of an attachment, by the plurality of clips, of the heat sink with the circuit board;
    wherein the plurality of clips comprise a clip, wherein the clip comprises first and second spring portions, an interface portion therebetween, first and second arm portions, and first and second end portions, wherein the first spring portion is coupled with the first arm portion, wherein the first arm portion terminates in the first end portion, wherein the second spring portion is coupled with the second arm portion, wherein the second arm portion terminates in the second end portion;
    wherein the interface portion is force-transmittingly engageable with an engagement portion of the heat sink;
    wherein the first arm portion is extendable through a first passage between first and second major faces of the circuit board;
    wherein the first end portion is abuttable with the second major face;

wherein the second arm portion is extendable through a second passage between the first and second major faces;

wherein the second end portion is abuttable with the second major face;

wherein the plurality of clips are configured to apply to the heat sink an expansion force that serves to promote distribution of force over the one or more adhesives and between the heat sink and the one or more electrical components;

wherein the plurality of clips provide attachment of the heat sink to the circuit board during transportation of the circuit board to allow solidification of the one or more adhesives.

13. The apparatus of claim 12 in combination with the heat sink and the circuit board, wherein the heat sink superimposes the first major face, wherein the engagement portion of the heat sink comprises a first engagement portion of the heat sink, wherein the heat sink comprises a second engagement portion, wherein the circuit board comprises third and fourth passages between the first and second major faces;

wherein the interface portion is force-transmittingly engageable with any one of the first engagement portion and the second engagement portion;

wherein the first arm portion is extendable through any one of the first passage and the third passage;

wherein the second arm portion is extendable through any one of the second passage and the fourth passage.

14. The apparatus of claim 12, wherein the clip comprises a first clip, wherein the plurality of clips comprise the first clip and a second clip, wherein the second clip comprises:

first and second spring portions;

an interface portion located between the first and second spring portions;

a first arm portion that terminates in a first end portion, wherein the first arm portion is coupled with the first spring portion; and a second arm portion that terminates in a second end portion, wherein the second arm portion is coupled with the second spring portion;

wherein the engagement portion of the heat sink comprises a first engagement portion of the heat sink, wherein the heat sink comprises a second engagement portion;

wherein the interface portion of the first clip force-transmittingly engages the first engagement portion, wherein the first arm portion of the first clip extends through the first passage, wherein the first end portion of the first clip abuts the second major face, wherein the second arm portion of the first clip extends through the second passage, wherein the second end portion of the first clip abuts the second major face;

wherein the interface portion of the second clip force-transmittingly engages the second engagement portion, wherein the first arm portion of the second clip extends through the third passage, wherein the first end portion of the second clip abuts the second major face, wherein the second arm portion of the second clip extends through the fourth passage, wherein the second end portion of the second clip abuts the second major face;

wherein the first and second end portions of the first clip and the first and second end portions of the second clip are configured to, upon forced abutment thereof with the first major face of the circuit board, apply the expansion force to the first and second engagement portions of the heat sink;

wherein the expansion force comprises first components directed toward the first major face of the circuit board and second components directed in either of two generally opposite directions along the first major face of the circuit board;

wherein the expansion force serves to promote distribution of force over the one or more adhesives and between the heat sink and the one or more electrical components.

15. The apparatus of claim 14, wherein all the first and second spring portions, the interface portions, the first and second arm portions, and the first and second end portions of the first and second clips cooperate to promote distribution of force between the heat sink and the one or more electrical components.

16. The apparatus of claim 14, wherein the vibration absorption property of the one or more adhesives dominates:

the vibration absorption property of the first clip; and a vibration absorption property of the second clip.

17. The apparatus of claim 12, wherein the first and second spring portions comprise respective first and second intermediate spring portions, wherein the first and second end portions comprise respective first and second end spring portions;

wherein, upon abutment of the first and second end spring portions with the second major face of the circuit board and force-transmission engagement of the interface portion with the engagement portion of the heat sink, the first and second end spring portions and the interface portion serve to cause tension in the clip that promotes distribution of force between the heat sink and the one or more electrical components.

18. An apparatus, comprising:

one or more adhesives that serve to provide at least primary attachment of a heat sink with one or more electrical components coupled with a circuit board;

wherein the circuit board comprises first and second faces, the apparatus further comprising:

a first clip coupled with a first engagement portion of the heat sink and the circuit board;

a second clip coupled with a second engagement portion of the heat sink and the circuit board;

wherein the first clip comprises first and second intermediate spring portions, a first interface portion therebetween, first and second arm portions, and first and second end spring portions, wherein the first intermediate spring portion is coupled with the first arm portion, wherein the first arm portion terminates in the first end spring portion, wherein the second intermediate spring portion is coupled with the second arm portion, wherein the second arm portion terminates in the second end spring portion;

wherein the second clip comprises third and fourth intermediate spring portions, a second interface portion therebetween, third and fourth arm portions, and third and fourth end spring portions, wherein the third intermediate spring portion is coupled with the third arm portion, wherein the third arm portion terminates in the third end spring portion, wherein the fourth intermediate spring portion is coupled with the fourth arm portion, wherein the fourth arm portion terminates in the fourth end spring portion;

wherein the first interface portion is force transmittingly engageable with a first engagement portion of the heat sink;

wherein the first arm portion is extendable through a first passage between first and second major faces of the circuit board;

wherein the first end spring portion is abuttable with the second major face;

wherein the second arm portion is extendable through a second passage between the first and second major faces;

wherein the second end spring portion is abuttable with the second major face;

wherein the second interface portion is force transmittingly engageable with a second engagement portion of the heat sink;

wherein the third arm portion is extendable through a third passage between the first and second major faces of the circuit board;

wherein the third end spring portion is abuttable with the second major face;

wherein the fourth arm portion is extendable through a fourth passage between the first and second major faces;

wherein the fourth end spring portion is abuttable with the second major face;

wherein the first, second, third, and fourth end spring portions are configured to, upon forced abutment thereof with the first major face of the circuit board, apply an expansion force to the first and second engagement portions of the heat sink;

wherein the expansion force comprises first components directed toward the first major face of the circuit board and second components directed in either of two generally opposite directions along the first major face of the circuit board;

wherein the expansion force serves to promote distribution of force over the one or more adhesives and between the heat sink and the one or more electrical components.

19. An apparatus, comprising:

means for holding a portion of a heat sink at a target location to allow one or more adhesives to form an at least primary attachment between the portion of the heat sink and one or more electrical components coupled with a circuit board;

wherein the means for holding comprises first and second spring portions, an interface portion therebetween, first and second arm portions, and first and second end portions, wherein the first spring portion is coupled with the first arm portion, wherein the first arm portion terminates in the first end portion, wherein the second spring portion is coupled with the second arm portion, wherein the second arm portion terminates in the second end portion;

wherein the interface portion comprises a plurality of legs that are force-transmittingly engageable with an engagement portion of the heat sink;

wherein the first arm portion is extendable through a first passage between first and second major faces of the circuit board;

wherein the first end portion is abuttable with the second major face;

wherein the second arm portion is extendable through a second passage between the first and second major faces;

wherein the second end portion is abuttable with the second major face.

20. The apparatus of claim 19, wherein the means for holding the portion of the heat sink at the target location to allow the one or more adhesives to form the at least primary attachment between the portion of the heat sink and the one or more electrical components coupled with the circuit board comprises:

means for substantially centering the portion of the heat sink at the target location to promote formation of the at least primary attachment between the portion of the heat sink and the one or more electrical components.

21. A method, comprising the steps of:

locating one or more adhesives between a heat sink and one or more electrical components coupled with a circuit board to provide at least primary attachment of the heat sink with the one or more electrical components; and coupling a clip with the heat sink and the circuit board, wherein the clip comprises first and second spring portions, an interface portion therebetween, first and second arm portions, and first and second end portions, wherein the first spring portion is coupled with the first arm portion, wherein the first arm portion terminates in the first end portion, wherein the second spring portion is coupled with the second arm portion, wherein the interface portion comprises a plurality of legs, wherein the second arm portion terminates in the second end portion;

wherein the step of coupling the clip with the heat sink and the circuit board comprises the steps of:

engaging the plurality of legs of the interface portion of the clip in a force-transmission relationship with an engagement portion of the heat sink;

extending the first arm portion of the clip through a first passage between first and second major faces of the circuit board;

abutting the first end portion with the second major face;

extending the second arm portion through a second passage between the first and second major faces; and abutting the second end portion with the second major face.

22. The method of claim 21, further comprising the step of:

absorbing, through employment of one or more of the one or more adhesives, a portion of a vibration, imparted to the circuit board and transmitted to the one or more electrical components, to prevent transmission of the portion of the vibration to the heat sink.

23. The method of claim 22, wherein the portion of the vibration comprises a portion of a first vibration, the method further comprising the step of:

absorbing, through employment of one or more of the one or more adhesives, a portion of a second vibration, imparted to the circuit board and transmitted to the heat sink through one or more clips, to prevent transmission of the portion of the second vibration to the one or more electrical components.

24. The method of claim 21, further comprising the step of:

absorbing, through employment of one or more of the one or more adhesives, a portion of a vibration, imparted to the circuit board and transmitted to the heat sink through one or more clips, to prevent transmission of the portion of the vibration to to one or more electrical components.

25. The method of claim 21, further comprising the step of:

holding a portion of the heat sink at a target location through employment of one or more clips, to allow the one or more adhesives to form the at least primary attachment between the portion of the heat sink and the one or more electrical components coupled with the circuit board.

26. The method of claim 21, wherein the step of locating the one or more adhesives between the heat sink and the one or more electrical components coupled with the circuit board to provide the at least primary attachment of the heat sink with the one or more electrical components comprises the step of;

substantially centering a portion of the heat sink at a target location through employment of one or more clips to promote formation of the at least primary attachment between the portion of the heat sink and the one or more electrical components.

27. A method, comprising the steps of:

holding a portion of a heat sink at a target location, through employment of a plurality of clips, to allow one or more adhesives to form an at least primary attachment between the portion of the heat sink and one or more electrical components coupled with a circuit board; and coupling a first clip and a second clip of the plurality of clips with the heat sink and the circuit board, wherein the first clip comprises first and second spring portions, an interface portion therebetween, first and second arm portions, and first and second end portions, wherein the first spring portion of the first clip is coupled with the first arm portion of the first clip, wherein the first arm portion of the first clip terminates in the first end portion of the first clip, wherein the second spring portion of the first clip is coupled with the second arm portion of the first clip, wherein the second arm portion of the first clip terminates in the second end portion of the first clip, wherein the second clip comprises first and second spring portions, an interface portion therebetween, first and second arm portions, and first and second end portions, wherein the first spring portion of the second clip is coupled with the first arm portion of the second clip, wherein the first arm portion of the second clip terminates in the first end portion of the second clip, wherein the second spring portion of the second clip is coupled with the second arm portion of the second clip, wherein the second arm portion of the second clip terminates in the second end portion of the second clip;

wherein the first and second end portions of the first clip and the first and second end portions of the second clip are configured to, upon forced abutment thereof with the first major face of the circuit board, apply the expansion force to the first and second engagement portions of the heat sink;

wherein the expansion force comprises first components directed toward the first major face of the circuit board and second components directed in either of two generally opposite directions along the first major face of the circuit board;

wherein the expansion force serves to promote distribution of force over the one or more adhesives and between the heat sink and the one or more electrical components;

wherein the step of coupling the first clip and the second clip of the plurality of clips with the heat sink and the circuit board comprises the steps of:

engaging the interface portion of the first clip in a force-transmission relationship with a first engagement portion of the heat sink;

extending the first arm portion of the first clip through a first passage between first and second major faces of the circuit board;

abutting the first end portion of the first clip with the second major face;

extending the second arm portion of the first clip through a second passage between the first and second major faces;

abutting the second end portion of the first clip with the second major face;

engaging the interface portion of the second clip in a force-transmission relationship with a second engagement portion of the heat sink;

extending the first arm portion of the second clip through a first passage between first and second major faces of the circuit board;

abutting the first end portion of the second clip with the second major face;

extending the second arm portion of the second clip through a second passage between the first and second major faces;

abutting the second end portion of the second clip with the second major face;

applying an expansion force to the first and second engagement portions of the heat sink through employment of the first clip and the second clip.

28. The method of claim 27, wherein the step of holding the portion of the heat sink at the target location, through employment of the plurality of clips, to allow the one or more adhesives to form the at least primary attachment between the portion of the heat sink and the one or more electrical components coupled with the circuit board comprises the step of:

substantially centering the portion of the heat sink at the target location through employment of the plurality of clips to promote formation of the at least primary attachment between the portion of the heat sink and the one or more electrical components.

29. The method of claim 27, further comprising the step of:

absorbing, through employment of one or more of the one or more adhesives, a portion of a vibration transmitted to the one or more of the one or more adhesives in promotion of maintenance of the at least primary attachment, by the one or more adhesives, of the portion of the heat sink with the one or more electrical components.

30. The apparatus of claim 1, wherein the interface portion comprises one or more legs that serve to secure the clip to the heat sink.

31. The apparatus of claim 30, wherein the one or more legs are crimped against one or more walls of the engagement portion of the heat sink to secure the clip to the heat sink.

32. The apparatus of claim 1, wherein the clip comprises a stainless steel clip.

33. The method of claim 27, further comprising the step of:

removing the one or more clips from the heat sink and the circuit board:

upon formation of the at least primary attachment by the one or more adhesives; and with reliance on the at least primary attachment by the one or more adhesives to effect connection of the heat sink and the circuit board.

34. A method, comprising the steps of:

applying one or more adhesives between a heat sink and one or more electrical components coupled with a circuit board to provide at least primary attachment of the heat sink with the one or more electrical components; and coupling a clip with the heat sink and the circuit board, wherein the clip comprises first and second spring portions, an interface portion therebetween, first and second arm portions, and first and second end portions, wherein the first spring portion is coupled with the first arm portion, wherein the first arm portion terminates in the first end portion, wherein the second spring portion is coupled with the second arm portion, wherein the interface portion comprises a plurality of legs, wherein the second arm portion terminates in the second end portion;

wherein the step of coupling the clip with the heat sink and the circuit board comprises the steps of:

extending the first arm portion of the clip through a first passage of any set of passages, of a plurality of available sets of passages in the circuit board;

extending the second arm portion of the clip through a second passage of the any set of passages; and engaging the plurality of legs of the interface portion of the clip in a force-transmission relationship with an engagement portion of the heat sink, wherein the engagement portion of the heat sink corresponds to the any set of passages.

35. The apparatus of claim 1, wherein the clip is removable from the heat sink and the circuit board.

36. The apparatus of claim 35, wherein the clip is removable from the heat sink and the circuit board subsequent to a formation of the at least primary attachment of the heat sink with the one or more electrical components by the one or more adhesives.

37. The apparatus of claim 35, wherein the clip is removable from the heat sink and the circuit board without compromise of the at least primary attachment of the heat sink to the one or more electrical components by the one or more adhesives.

38. The apparatus of claim 12, wherein the clip is removable from the heat sink and the circuit board.

39. The apparatus of claim 38, wherein the clip is removable from the heat sink and the circuit board subsequent to a formation of the at least primary attachment of the heat sink with the one or more electrical components by the one or more adhesives.

40. The apparatus of claim 38, wherein the clip is removable from the heat sink and the circuit board without compromise of the at least primary attachment of the heat sink to the one or more electrical components by the one or more adhesives.

41. The apparatus of claim 18, wherein the clip is removable from the circuit board and the heat sink.

42. The apparatus of claim 41, wherein the clip is removable from the circuit board and the heat sink subsequent to a formation of the at least primary attachment of the heat sink with the one or more electrical components by the one or more adhesives.

43. The apparatus of claim 41, wherein the clip is removable from the circuit board and the heat sink without compromise of the at least primary attachment of the heat sink to the one or more electrical components by the one or more adhesives.

44. The apparatus of claim 19, wherein the means for holding the portion of the heat sink at the target location is removable from the portion of the heat sink and the circuit board.

45. The apparatus of claim 44, wherein the means for holding the portion of the heat sink at the target location is removable from portion of the heat sink and the circuit board subsequent to a formation of the at least primary attachment between the portion of the heat sink and the one or more electrical components by the one or more adhesives.

46. The apparatus of claim 44, wherein the means for holding the portion of the heat sink at the target location is removable from the portion of the heat sink and the circuit board without compromise of the at least primary attachment between the portion of the heat sink and the one or more electrical components by the one or more adhesives.

47. The method of claim 21, further comprising the step of:

removing the clip from the heat sink and the circuit board.

48. The method of claim 47, wherein the step of removing the clip from the heat sink and the circuit board comprises the step of:

removing the clip from the heat sink and the circuit board subsequent to a formation of the at least primary attachment of the heat sink with the one or more electrical components by the one or more adhesives.

49. The method of claim 47, wherein the step of removing the clip from the heat sink and the circuit board comprises the step of:

removing the clip from the heat sink and the circuit board without compromise of the at least primary attachment of the heat sink with the one or more electrical components by the one or more adhesives.

50. The method of claim 33, wherein the step of removing the plurality of clips from the heat sink and the circuit board comprises the step of:

removing the plurality of clips from the heat sink and the circuit board without compromise of the connection of the heat sink and the circuit board.

51. The method of claim 34, further comprising the step of:

removing the clip from the heat sink and the circuit board.

52. The method of claim 51, wherein the step of removing the clip from the heat sink and the circuit board comprises the step of:

removing the clip from the heat sink and the circuit board subsequent to a formation of the at least primary attachment of the heat sink with the one or more electrical components by the one or more adhesives.

53. The method of claim 51, wherein the step of removing the clip from the heat sink and the circuit board comprises the step of:

removing the clip from the heat sink and the circuit board without compromise of the at least primary attachment of the heat sink with the one or more electrical components by the one or more adhesives.

54. The apparatus of claim 1, wherein the plurality of legs are substantially parallel to each other and substantially orthogonal to the first major face of the circuit board to allow removal of the clip upon solidification of the one or more adhesives.

55. The apparatus of claim 18, wherein the expansion force serves to promote a more thorough and greater expanse of bonding of the one or more adhesives with heat sink and the one or more electrical components.

56. The apparatus of claim 55, wherein the first and second end spring portions are positioned, formed, and compressed to exert a first force against a portion of the second major face of the circuit board adjacent one of the first and second passages;
- wherein the first force serves to tend to cause a deflection of the first and second end spring portions generally away from a central location on the second major face between the first, second, third, and fourth passages;
- wherein the deflection of the first and second end spring portions tends to pivot the first and second arm portions outward from the first interface portion and cause an outward pull of the first and second intermediate spring portions away from the first interface portion;
- wherein the outward pull of the first and second intermediate spring portions promotes a deflection thereof away from the first interface portion;
- wherein the third and fourth end spring portions are positioned, formed, and compressed to exert a second force against a portion of the second major face of the circuit board adjacent one of the third and fourth passages;
- wherein the second force serves to tend to cause a deflection of the third and fourth end spring portions generally away from the central location on the second major face between the first, second, third, and fourth passages;
- wherein the deflection of the third and fourth end spring portions tends to pivot the third and fourth arm portions outward from the second interface portion and cause an outward pull of the third and fourth intermediate spring portions away from the second interface portion;
- wherein the outward pull of the third and fourth intermediate spring portions promotes a deflection thereof away from the first interface portion;
- wherein the deflection of the first and second intermediate spring portion away from the first interface portion and the deflection of the third and fourth intermediate spring portion away from the second interface portion cause the expansion force at the first and second engagement portions of the heat sink.

57. The apparatus of claim 56, wherein the first and second end spring portions are configured at approximately forty-five degrees relative to the first and second intermediate spring portions to exert the first force against the portion of the second major face of the circuit board adjacent one of the first and second passages;
- wherein the third and fourth end spring portions are configured at approximately forty-five degrees relative to the third and fourth intermediate spring portions to exert the second force against the portion of the second major face of the circuit board adjacent one of the third and fourth passages.

58. The apparatus of claim 19, wherein the plurality of legs engage one or more recesses of the engagement portion of the heat sink.

59. The method of claim 21, wherein the step of engaging the plurality of legs of the interface portion of the clip in the force-transmission relationship with the engagement portion of the heat sink comprises the step of:
- engaging the plurality of legs of the interface portion of the clip in the force-transmission relationship with one or more recesses of the engagement portion of the heat sink.

60. The method of claim 34, wherein the step of engaging the plurality of legs of the interface portion of the clip in the force-transmission relationship with the engagement portion of the heat sink comprises the step of:
- engaging the plurality of legs of the interface portion of the clip in the force-transmission relationship with one or more recesses of an engagement portion of the heat sink.

* * * * *